United States Patent
Flinsenberg

(10) Patent No.: US 10,681,787 B2
(45) Date of Patent: Jun. 9, 2020

(54) LIGHTING SYSTEM AND A METHOD OF ESTIMATING AN END OF LIFE OF AT LEAST ONE LAMP THEREOF

(71) Applicant: SIGNIFY HOLDING B.V., Eindhoven (NL)

(72) Inventor: Ingrid Christina Maria Flinsenberg, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 136 days.

(21) Appl. No.: 15/566,417

(22) PCT Filed: Mar. 25, 2016

(86) PCT No.: PCT/EP2016/056722
§ 371 (c)(1),
(2) Date: Oct. 13, 2017

(87) PCT Pub. No.: WO2016/165931
PCT Pub. Date: Oct. 20, 2016

(65) Prior Publication Data
US 2018/0302972 A1 Oct. 18, 2018

(30) Foreign Application Priority Data

Apr. 14, 2015 (EP) .................................. 15163518

(51) Int. Cl.
*H05B 45/58* (2020.01)
*H05B 47/20* (2020.01)
*G01R 31/44* (2020.01)

(52) U.S. Cl.
CPC ............ *H05B 45/58* (2020.01); *G01R 31/44* (2013.01); *H05B 47/20* (2020.01)

(58) Field of Classification Search
CPC .... H05B 33/0893; H05B 37/03; H05B 45/58; H05B 47/20; G01R 31/44
See application file for complete search history.

(56) References Cited

U.S. PATENT DOCUMENTS

| 2003/0015973 | A1 | 1/2003 | Ovens et al. |
| 2007/0040696 | A1 | 2/2007 | Mubaslat et al. |
| 2009/0254287 | A1* | 10/2009 | Ohgoh ............... H05B 33/0893 702/34 |
| 2010/0007590 | A1* | 1/2010 | Chae ........................ G09G 3/32 345/84 |
| 2010/0176746 | A1* | 7/2010 | Catalano .................. G01K 7/01 315/297 |

(Continued)

*Primary Examiner* — Jeff W Natalini
(74) *Attorney, Agent, or Firm* — Meenakshy Chakravorty

(57) ABSTRACT

A lighting system (100; 120) comprises at least one lamp (10) and a processing unit (20) for estimating an end-of-life of the at least one lamp (10). The processing unit (20) is configured to receive a lamp burning time during which the at least one lamp is turned on and a forecasted temperature over a selected period of time at a location of the at least one lamp. The processing unit (20) is configured to estimate the end of life of the at least one lamp based on the lamp burning time and the forecasted temperature. By using the forecasted temperature, use of dedicated lamp sensors measuring internal parameters of the lamp usable for the end-of-life estimate may be avoided and the estimate may be simplified.

14 Claims, 6 Drawing Sheets

(56) References Cited

U.S. PATENT DOCUMENTS

| | | | |
|---|---|---|---|
| 2011/0043378 A1* | 2/2011 | Bailey | G08G 1/07 |
| | | | 340/917 |
| 2011/0254554 A1 | 10/2011 | Harbers | |
| 2013/0204456 A1* | 8/2013 | Tippelhofer | B60L 15/2045 |
| | | | 701/1 |
| 2014/0074434 A1 | 3/2014 | De Lima et al. | |
| 2015/0020297 A1* | 1/2015 | Durkin | E03D 11/00 |
| | | | 4/255.03 |
| 2016/0364975 A1* | 12/2016 | R | G06N 5/04 |
| 2017/0231071 A1* | 8/2017 | Elinsenberg | H05B 37/03 |

* cited by examiner

LIGHTING SYSTEM AND A METHOD OF ESTIMATING AN END OF LIFE OF AT LEAST ONE LAMP THEREOF

CROSS-REFERENCE TO PRIOR APPLICATIONS

This application is the U.S. National Phase application under 35 U.S.C. § 371 of International Application No. PCT/EP2016/056722, filed on Mar. 25, 2016, which claims the benefit of European Patent Application No. 15163518.2, filed on Apr. 14, 2015. These applications are hereby incorporated by reference herein.

FIELD OF THE INVENTION

The invention relates to a lighting system comprising at least one lamp. The invention further relates to a method of estimating the end of life of the at least one lamp of the lighting system.

BACKGROUND

At present, lighting systems in various configurations are developed and designed for many purposes, e.g. for general illumination, street illumination, advertisement, emergency lighting and city decoration.

The use of data analytics and intelligent interpretation of data collected from such lighting systems, may become a key-differentiating factor in the lighting systems market.

For example, lighting systems may collect information about the presence of individuals, ambient light, dimming levels, power consumption, user interactions, user preferences, demand response, device status, diagnostics, alerts and many other types of information.

Data analytics can be used to maintain the lighting system in a more efficient manner, by for example predicting end-of-life occurrences in the lighting system and thereby assuring citizens that down-time occurrences in the system will be less frequent. An accurate prediction of the life time of the lighting system offers preventive maintenance services which can significantly reduce maintenance costs and improve safety of the system.

US Patent application US 2014/0074434 A1 with title "Method and apparatus for end-of-life estimation of solid state lighting fixtures" describes an apparatus for estimating end-of-life for solid-state lighting.

In the known apparatus, actual operating parameters, such as the time of usage of a solid-state lighting fixture, the temperature of the solid-state lighting fixture and a current supplied to the lighting fixture over time are compared with estimated life time prediction data stored in a look-up table, such that a prediction of the lifetime status of the lighting fixtures may be obtained.

As a consequence, in US 2014/0074434 A1, detailed monitoring of the solid-state lighting fixtures is required. The known lighting system requires thus expensive local sensors measuring the time of usage, the temperature and the current of the solid-state lighting fixture in order to make end-of-life estimates. Further, since multiple parameters need to be monitored, a significant amount of data logging is required, increasing overall complexity and cost of the known system.

Another problem of the known lighting system is that the end-of-life estimates cannot be retrieved from the look-up table when e.g. a local sensor fails.

As a consequence, in the known lighting system, lifetimes of the local sensors must be guaranteed to be longer than the lifetimes of the solid-state lighting fixtures.

SUMMARY OF THE INVENTION

A lighting system as in claim 1 addresses the above mentioned problems. The lighting system comprises at least one lamp and a processing unit for estimating an end of life of the at least one lamp. The processing unit is configured to receive:
  a lamp burning time during which the at least one lamp is turned on, and
  a forecasted temperature over a selected period of time in the future at a location of the at least one lamp.

The processing unit is configured to estimate the end of life of the at least one lamp based on the lamp burning time and the forecasted temperature.

By receiving the forecasted temperature at the location of the lamp over a selected period of time in the future and the lamp burning time, the end of life of the lamp may be estimated without making use of any local lamp sensors. In fact the lamp burning time may be derived from fixed turn on and turn-off time patterns, which may be remotely triggered by a user via e.g. a control unit or by seasonal sunrise-sunset periodical time cycles. The forecasted temperature may be provided by a nearby weather station, which may be communicatively connectable (e.g. via the internet or wirelessly) to the processing unit to provide the forecasted temperature over a selected period of time in the future to the processing unit. As a consequence, differently from the known lighting system, in the invention no local sensors are required in the lamp for the lifetime estimation.

In one embodiment, the processing unit may be further configured to receive a measured temperature in proximity of the at least one lamp and to estimate the end of life of the lamp based also on the measured temperature.

The measured temperature may be provided by the nearby weather station. The weather station may be arranged to measure actual ambient temperatures in proximity of the lamp, thereby saving the extra costs of implementing local lamp temperature sensors.

Alternatively, the lighting system may comprise at least one temperature sensor coupled to the at least one lamp, wherein the at least one temperature sensor is configured to measure the temperature of the at least one lamp. In the invention, the temperature sensor is not essential for estimating the lifetime of the lamp. In the invention, if the temperature sensor fails, the lifetime of the lamp can be still estimated by only using the forecasted temperature and the lamp burning time. When desired, the weather station can provide the ambient temperature in proximity of the lamp. When present, the temperature sensor does not need to have a lifetime longer than the lifetime of the lamp because the lifetime estimate can be still provided by the forecasted temperature, or the weather station data can be used as a back-up of the failed temperature sensor. Thereby, when present, the temperature sensor can be less rugged and cheaper than the temperature sensor used in the known lighting system.

In one embodiment the processing unit is configured to:
  determine the lamp burning time over a period of time in the past up to the present, and
  determine a future lamp burning time over the selected period of time in the future based on the forecasted temperature, and add the determined lamp burning time to the future burning time to obtain a corrected lamp burning time at a date corresponding to an end date of the selected period of time in the future.

By adding the determined lamp burning time to the future burning time and by using the forecasted temperature, a total burning time estimate may be obtained at a selected date in the future. From the corrected burning time estimate, the end-of-life of the at least one lamp may be estimated with better precision.

In an embodiment the processing unit is configured to determine the future burning time based on the determined lamp burning time.

In the latter embodiment, the future burning time may be determined by averaging the lamp burning time determined up to a present date over a selected period in the future. The estimate of the end-of-life of the at least one lamp may thus depend only on the determined lamp burning time, which may be measured. The estimate may be thus simplified.

In yet another embodiment, the future lamp burning time may be determined by using weather forecast data. For example, the future burning time estimate can take into account sunrise and sunset time cycles.

In an embodiment the processing unit is configured to:
compare the corrected lamp burning time to a laboratory burning time obtained during lifetime test for one or more dates, and
select one of the dates whose corrected lamp burning time corresponds to the laboratory burning time for estimating the end of life of the at least one lamp.

The end of life of the lamp may be estimated choosing a date in the future for which the estimated corrected lamp burning time is equal or close to the lifetime determined during laboratory lifetime test. Laboratory lifetime tests may produce statistical distributions of lifetime data, in which case a likelihood of reaching the end of life of the lamp may be estimated.

In yet another embodiment, the processing unit is further configured to:
determine a first correction factor depending on the forecasted temperature, and
multiply the determined lamp burning time by the first correction factor and the selected period of time in the future for determining the future lamp burning time.

The future burning time may be thus determined from the lamp burning time calculated over the period of time in the past up to the present, multiplied by the selected period of time in the future and corrected with a correction factor dependent on the forecasted temperature. By correcting the burning time with the first correction factor, yet a better lifetime estimate accuracy can be achieved.

An aspect of the invention concerns a method of estimating an end-of-life of at least one lamp of a lighting system.

BRIEF DESCRIPTION OF THE DRAWINGS

These and other aspects of the invention are apparent from and will be elucidated with reference to the embodiments described hereinafter. In the drawings.

Figure 1:
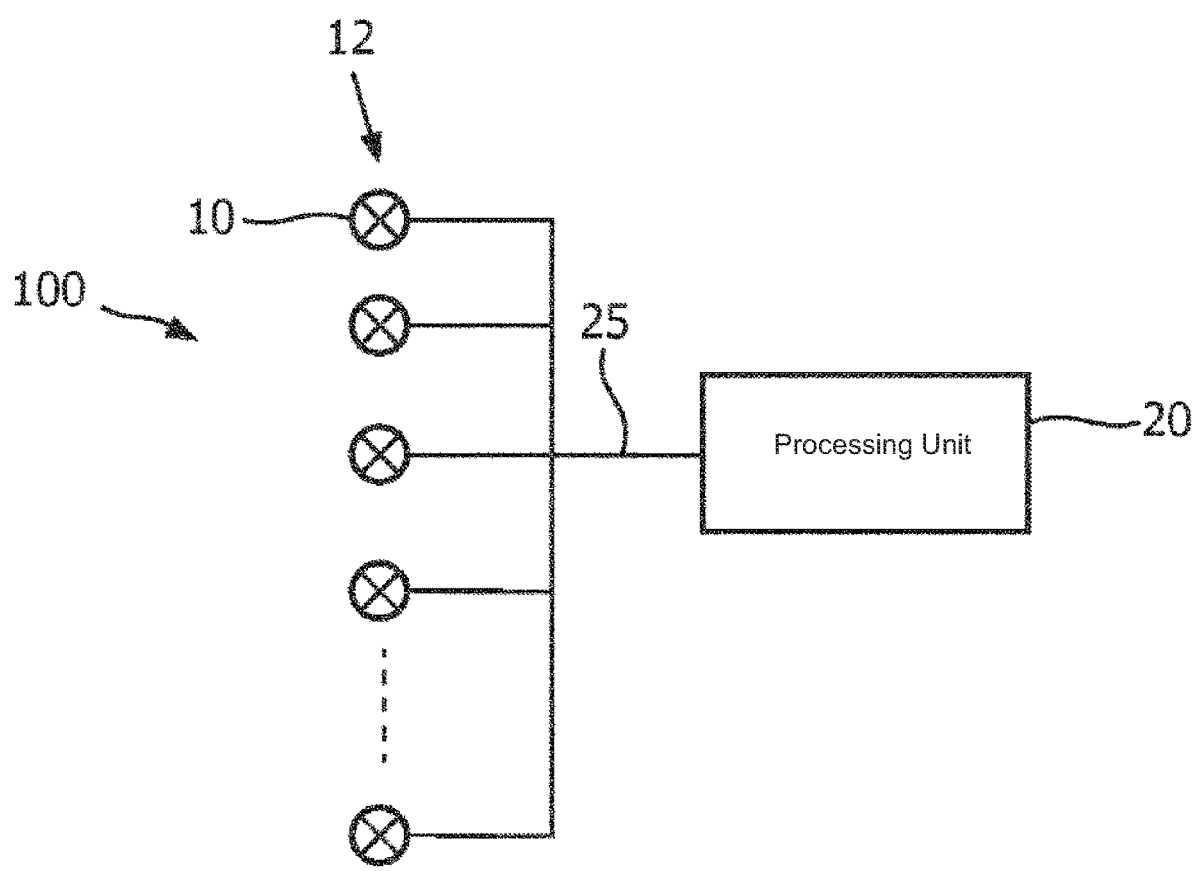
FIG. 1 shows a schematic representation of a first embodiment of a lighting system.

Items that have the same reference numbers in different figures, have the same structural features and the same functions, or are the same signals. Where the function and/or structure of such an item has been explained, there is no necessity for repeated explanation thereof in the detailed description.

DETAILED DESCRIPTION OF EMBODIMENTS

While this invention is susceptible of embodiments in many different forms, there is shown in the drawings and will herein be described in detail one or more specific embodiments, with the understanding that the present disclosure is to be considered as exemplary of the principles of the invention and not intended to limit the invention to the specific embodiments shown and described.

FIG. 1 shows a schematic representation of a first embodiment of a lighting system 100.

The lighting system 100 comprises at least one lamp 10 and a processing unit 20.

The lighting system 100 may be an outdoor lighting system suitable for outdoor illumination, e.g. for city lighting, street lighting or building lighting.

The lighting system may comprise more than one lamp, e.g. a plurality of lamps 12.

The lamps 12 may be any type of lamps suitable for the specific implementation. For example, the lamps 12 may be lamps based on solid state lighting (SSL) technologies such as light-emitting diodes (LEDs), or traditional fluorescent lights, or incandescent lamps.

The lamps 12 may be placed in any type of lighting fixtures suitable for the specific implementation. For example, the lamps may be placed in outdoor lamp poles, posts masts or standards to illuminate e.g. streets, buildings from a suitable height.

The processing unit 20 estimates the end of life of the at least one lamp 10. The processing unit 20 receives for the at least one lamp 10, a lamp burning time during which the at least one lamp 10 is turned on and a forecasted temperature over a selected period of time in the future at a location of the at least one lamp 10. The processing unit 20 estimates the end of life of the at least one lamp 10 based on the lamp burning time and the forecasted temperature.

As shown in FIG. 1 by the continuous line connecting the at least one lamp 10 to the processing unit 20, the processing unit 20 may be communicatively connectable to the at least one lamp 10.

The processing unit 20 may be a centralized processor collecting data from the lamps 12. The centralized processor may be located in proximity of the light system 100 or at a location remote from the lighting system 100. Alternatively, the processing unit 20 may be distributed within the lighting system 100, e.g. implemented in the lamp 10 or the lamps 12.

The processing unit 20 may be wired or wirelessly connected to the lamp 10 via a first communication channel 25.

The first communication channel 25 may be a computer network connection, e.g., an internet connection. For example, all or part of the first communication channel 25 may be a wired connection, say an Ethernet connection; all or part of communication channel 25 may be a wireless connection, say a Wi-Fi connection. Alternatively other wireless RF links, such as Bluetooth®, Zigbee, Z-wave, 802.11s, or 802.15.4 could be used.

Alternatively, the processing unit 20 may be disconnected from the lamps 10 and communicatively connectable to a control unit (not shown in FIG. 1) controlling the lamps. The control unit may provide the lamp burning time to the processing unit 20.

In yet another example, the processing unit 20 may be disconnected from the lamps 12 and the control unit, and the lamp burning time may be derived directly from information about the location of the lamps 12, e.g. weather conditions at the location, duration of day-hours and night-hours at the location.

The processing unit 20 may estimate the end of life of the at least one lamp 10 of the lighting system 100 by using solely the lamp burning time and the forecasted temperature.

The actual lifetime of lamps, e.g. LED lamps, typically depends on the actual temperature conditions at which the lamps operate, i.e. an operational temperature. Rated lifetime of the lamps is typically determined during laboratory tests at a constant temperature.

Once a lamp is installed, temperature conditions at the location may vary from the temperature conditions selected during the laboratory tests. The lifetime of the installed lamp is typically shorter than the lifetime determined during the laboratory tests. As a consequence, during its operational lifetime, the lamp typically ages faster.

Assuming that the correction factor between the operational conditions and laboratory test conditions in function of the temperature is known, a fixed relation for the actual burning time of the lamp versus laboratory burning time can be found as follows:

$$B_a = F(T - T_L) * B_L. \quad (1)$$

In equation (1), $B_a$ is the corrected burning time during operational conditions, $B_L$ is the laboratory burning time during laboratory tests conditions, and $F(T-T_L)$ is the known correction factor depending on the difference between the operational temperature T and the test temperature $T_L$. The correction factor F may increase when the temperature difference $T-T_L$ increases and decrease when the temperature difference $T-T_L$ decreases. For example, lamps may age a factor 1.1 to 2.0 times faster for a temperature difference increase of 10 degrees Celsius. For example, for a factor of 1.3 age increase per 10 degrees Celsius increase of the temperature, the correction factor may be determined as follows:

$$F(T - T_L) = 1.3^{\frac{(T-T_L)}{10}}. \quad (1.1)$$

The processing unit 20 may be configured to determine a present burning time over a period of time in the past up to the present, determine a future lamp burning time over a selected period of time in the future based on the forecasted temperature, and add the present burning time to the future burning time to obtain a corrected lamp burning time at a date corresponding to an end of the selected period of time in the future.

To explain further, if $d_1$ is the present date, $d_2-d_1$ is the selected period of time in the future, and $d_2$ is the date at the end of the selected period, a corrected amount of burning time $B_{d2}$ at a selected date $d_2$ in the future may be estimated as:

$$B_{d2} = B_{d1} + F_1(T_F - T_L) * B_{d1} * \frac{d_2 - d_1}{d_1}, \quad (2)$$

wherein $B_{d1}$ is the present lamp burning time up to the present date $d_1$, $F_1$ is a correction factor depending on the difference between the forecasted temperature $T_F$ and the test temperature $T_L$ used during laboratory test conditions. The corrected amount of burning time $B_{d2}$ may be thus the sum between the present lamp burning time $B_{d1}$ up to the present date $d_1$ and an average future burning time based on the factor $F_1$, and in this example, also on the present lamp burning time $B_{d1}$.

The future burning time is determined as a multiplication of the present burning time $B_{d1}$ up to the present date $d_1$ by the relative time difference between the selected date $d_2$ in the future and the present date $d_1$ and corrected by the factor $F_1(T_F-T_L)$.

The processing unit 20 may be configured to determine the correction factor $F_1(T_F-T_L)$. $F_1$ depending on the forecasted temperature $T_F$ and, in the example described with reference to equation (2), the test temperature $T_L$. The processing unit 20 may be further configured to multiply the present lamp burning time $B_{d1}$ by the correction factor $F_1$ and the selected period of time in the future relative to the present time, i.e. for the example of equation (2), the time between the time difference between the date $d_2$ in the future and the present date $d_1$ divided by the present date $d_1$.

The forecasted temperature $T_F$ is a field parameter that can be obtained for the lamps located in proximity of the lamp 10. Thereby the forecasted temperature $T_F$ represents a single parameter, e.g. a long or short term temperature forecast profile, or a year, or periodical or seasonal average temperature that can be used to correct the future burning time for multiple lamps. The present burning time may be determined as explained above, locally by using a local burning time sensor, or remotely by monitoring turn-on and turn-off times of the lamp 10. The corrected amount of burning time $B_{d2}$ at the selected date $d_2$ may be translated into an actual date indicating the end of life date of the lamp 10.

For example, the corrected amount of burning time $B_{d2}$ may be compared to a laboratory burning time obtained during a lifetime test. The end of life date of the lamp 10 may be determined by comparing the corrected amount of burning time $B_{d2}$ for one or more dates and select one of dates whose corrected amount of burning time $B_{d2}$ corresponds to the laboratory burning time obtained during the lifetime tests. Several laboratory lifetime tests may be performed to obtain a statistical distribution of the lifetime of the lamp. By comparing the corrected amount of burning time $B_{d2}$ to the statistical distribution found in the laboratory, a likelihood of reaching the end of life of the lamp 10 may be estimated. The estimate of the end of life date may be used to e.g. replace the lamp 10 before its end of life date.

In an embodiment, the processing unit 20 may be configured to determine the future lamp burning time based on forecasted weather data.

For example, the future lamp burning time may be based on a period of the year weather forecast for the specific location of the lighting system 100. The weather forecast may give information over the day and night time pattern, e.g. a sunrise and sunset time cycle, over the period, thereby providing a forecast of a future operational burning time. According to this embodiment, equation (2) may be adapted to:

$$B_{d2} = B_{d1} + F_1(T_F - T_L) * \sum_{i=d_1}^{d_2} b_i, \quad (3)$$

where b is the forecasted burning time at date i, which may for example be based on the sunrise and sunset time cycles at the location of the lamp 10 in the period of time from date $d_1$ to date $d_2$.

The accuracy of the end of life estimate may be further improved by taking into account weather forecast data for the future lamp burning time estimation.

In one embodiment, the processing unit may be further configured to receive from the lamp 10 a measured temperature and to estimate the end of life of the lamp 10 also based on the measured temperature.

By measuring the temperature of the lamp 10, estimate of the end of life of the lamp 10 may be further improved.

Referring to equation (2) above, the present lamp burning time $B_{d1}$ may be corrected by a second factor $F_2$ depending on the temperature difference between the measured temperature $T_M$ and the test temperature $T_L$. The corrected amount of burning time $B_{d2}$ may be determined as follows:

$$B_{d2} = B_{d1} * F_2(T_M - T_L) + F_1(T_F - T_L) * B_{d1} * \frac{d_2 - d_1}{d_1}, \quad (4)$$

In equation (4), both the future lamp burning time and the present burning time $B_{d1}$ are corrected with the respective first correction factor $F_1$ and second correction factor $F_2$, thereby increasing the accuracy of the estimate of the corrected amount of burning time $B_{d2}$ at the selected date $d_2$.

The processing unit 20 may be configured to determine the second correction factor $F_2$ depending on the measured temperature and multiply the present lamp burning time $B_{d1}$ by the second correction factor $F_2$.

Figure 2:
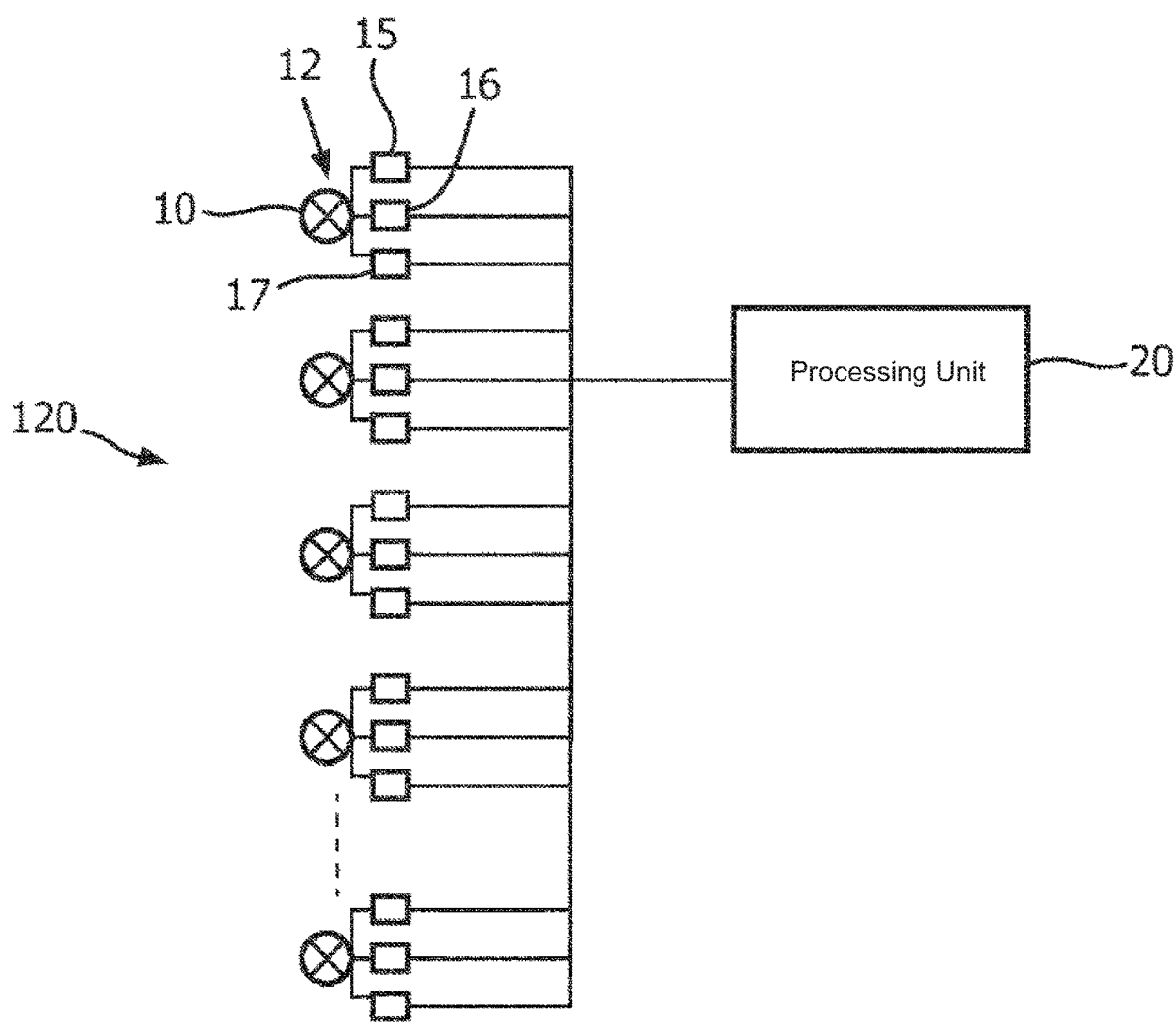
FIG. 2 shows a schematic representation of a second embodiment of a lighting system.

In an embodiment, described with reference to FIG. 2, the lighting system 120 may include at least one lamp 10, e.g. part of the plurality of lamps 12, and a processing unit 20. The lighting system 120 may further include at least one temperature sensor 15 coupled to the lamp 10. The temperature sensor 15 may be configured to measure the temperature of the lamp 10.

Further to the temperature sensor 15, the lighting system 120 may comprise at least one burning time sensor 16 and/or at least one location sensor 17 coupled to the lamp 10.

The burning time sensor 16 may be configured to measure the burning time of the lamp. For example, the burning time sensor 16 may be a switch controlled with a timer clock or any other suitable device to control the turn-on, turn-off times of the lamp 10.

The location sensor 17 may be configured to provide the location of the lamp 10 to the processing unit. For example, the location sensor may include a Global Positioning System (GPS) receiver to obtain geographical coordinates of the lamp 10 in a map. However, other types of location sensors or systems are possible.

The processing unit 20 may be configured to estimate the lifetime of the lamp as described with reference to equations (1) to (4).

Local sensors 15, 16, or 17 coupled to the lamp 10 may further improve accuracy of the estimate of the lifetime of the lamp. For example, in large lighting systems, lamps may be spread apart in different geographical locations. In this case, local location and temperature measurements may allow a better accuracy.

It should be noted that in comparison to the known lighting systems, in the lighting system 120 of the invention, local sensors 15, 16, or 17 are not essential components of the lighting system 120. In the known lighting systems, as described in US 2014/0074434 A1, local sensors embedded in the lighting fixtures are necessary for estimating the lifetime of the lamps. In the known lighting system, if one of the sensors coupled to the lighting fixture fails, the lifetime of the lamp associated with the respective lighting fixture cannot be anymore estimated. In the known lighting system, the lifetime of the sensors must be guaranteed to be longer than the lifetime of the lamps, otherwise the lifetime of the lamp cannot be predicted. The local sensors of the known system need to be more rugged than the lamps, thus need to be expensive.

In the invention, this problem is solved. Even if the local sensors 15, 16, or 17 are absent or broken, the lifetime of the lamps 20 can be estimated thanks to the use of the forecasted temperature at the location of the lamps and the lamp burning time. The location of the lamps is known once the system is installed and operational. Both the forecasted temperature and the lamp burning time are parameters that do not require local individual sensors for each lamp. When the local sensor 15, 16, or 17 are present, the lifetimes of the local sensor 15, 16, or 17 do not need to be longer than the lifetime of the lamp 10 because in case of a failure of the sensors, lifetime estimation is still possible. Therefore, when present, the local sensors 15, 16, or 17 can be less rugged than in the known system. When present, the local sensors 15, 16, or 17 can be cheaper than local sensors used in the known systems.

Figure 3:
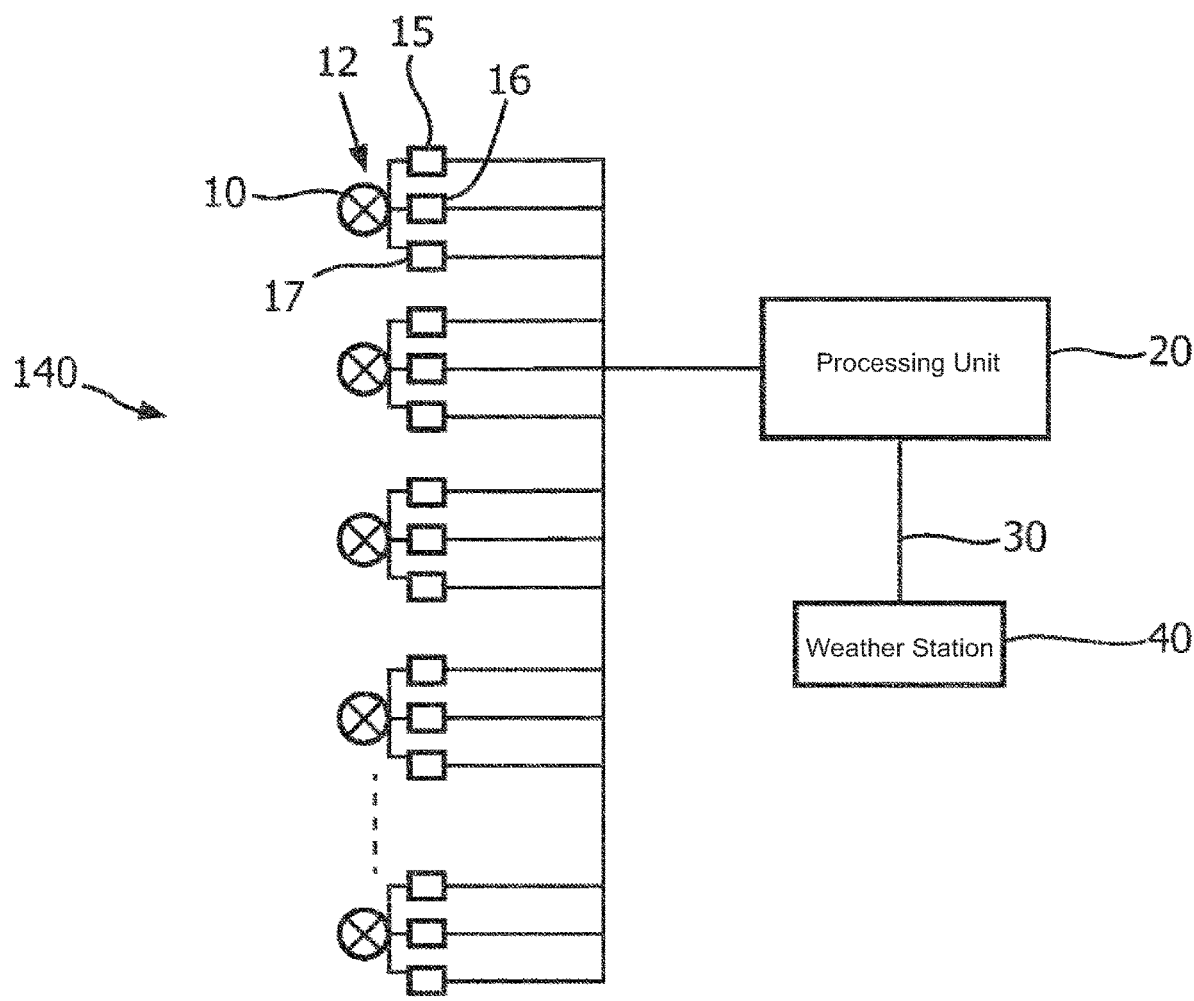
FIG. 3 shows a schematic representation of a third embodiment of a lighting system.

FIG. 3 shows a schematic representation of a third embodiment of a lighting system 140. The lighting system 140 comprises as the lighting system 100 and 120 at least one lamp 10, e.g. part of a plurality of lamps 12, and a processing unit 20. The lighting system 140 differs from the lighting system 120 in that the processing unit 20 is further connected to a weather station 40 arranged in proximity of the lamp 10. The weather station 40 may be configured to forecast the temperature at the location of the at least one lamp 10, and send the forecasted temperature to the processing unit 20.

In an embodiment, the weather station 40 may be further configured to measure the temperature in proximity of the at least one lamp 10, and send the measured temperature to the processing unit 20.

In the latter embodiment, the measured temperature may be directly provided by the weather station 40, e.g. ambient temperature may be measured, thereby avoiding the use of the temperature sensor 15 at the lamp 10.

In an embodiment, the weather station 40 may be further configured to provide a location of the weather station 40 to the processing unit 20.

In the latter embodiment, information about the location of the lamp 10 may be directly provided by the weather station 40, i.e. the weather station location, or be known from an earlier knowledge of the location of the installation, thereby avoiding the use of the location sensor 17.

The processing unit 10 may be communicatively connected via a second communication channel 30 to the weather station 40 to retrieve the information about the location, measured or forecasted temperature.

The second communication channel 30 may be a computer network connection, e.g., an internet connection. For example, all or part of the second communication channel may be a wired connection, say an Ethernet connection; all or part of the second communication channel may be a wireless connection, say a Wi-Fi connection. Alternatively other wireless RF links, such as Bluetooth®, Zigbee, Z-wave, 802.11s, or 802.15.4 could be used.

Figure 4:
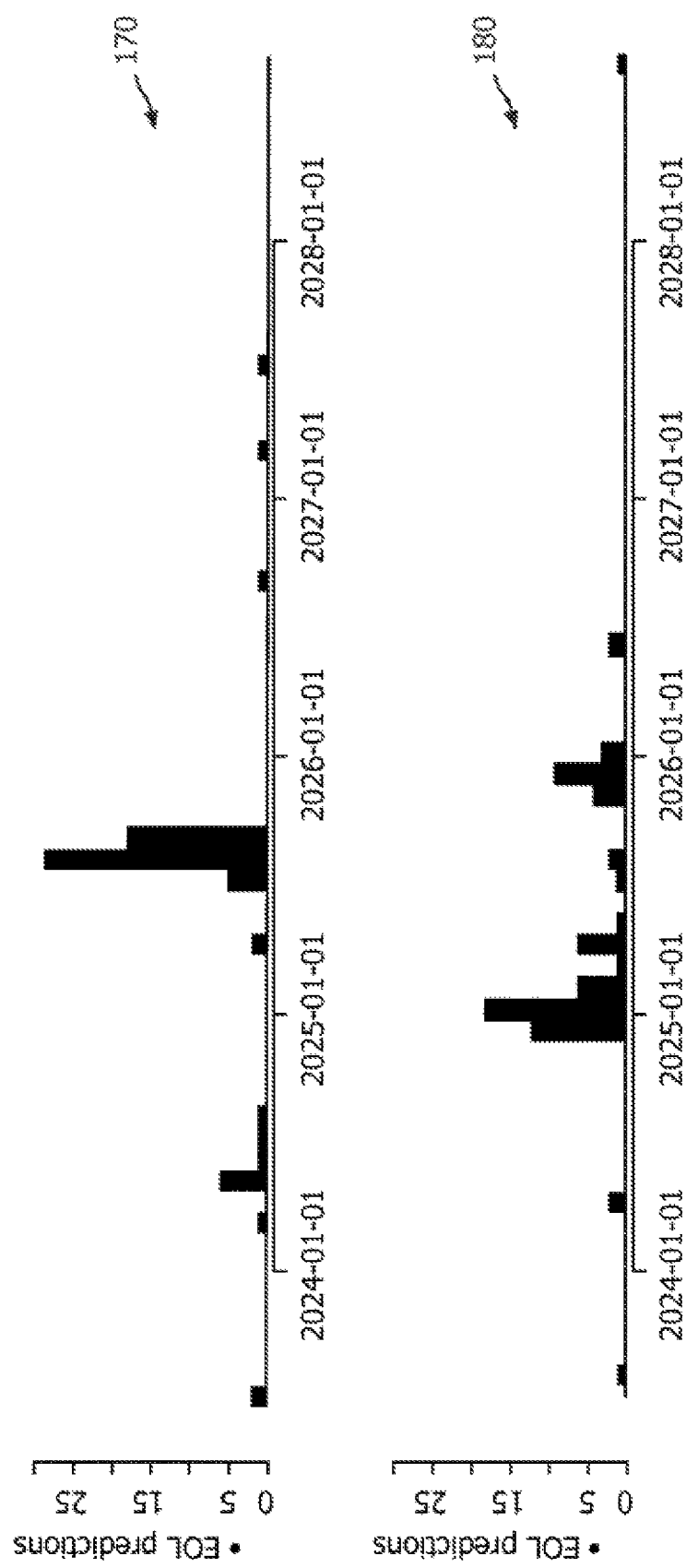
FIG. 4 shows a diagram of an end-of life estimate for the lighting system according to two different embodiments of the invention.

FIG. 4 shows two diagrams 170 and 180 of end-of-life estimates for a lighting system according to two different embodiments of the invention. For these particular diagrams a constant test temperature of 25 degrees Celsius, i.e. $T_L=25$ C, and an average burning time of 12 hours per day have been used.

Diagrams 170 and 180 show a number of end-of-life occurrences (in the vertical axis) versus the actual end-of-life date of the lamps in the lighting system concerned.

Diagram 170 relates to a lighting system according to the embodiment as described with reference to equations (2) or (3), i.e. wherein the end-of-life estimate is determined only by taking into account the forecasted temperature.

Diagram 180 relates to a lighting system according to the embodiment as described with reference to equation (4), wherein e.g. the measured temperature in proximity of the lamp is also available.

Diagrams 170 and 180 show that the spread of the end-of-life estimate among the lamps increases when the measured temperature (in diagram 180) is used. The larger spread indicates a more accurate prediction of the end-of-life of the lamps.

Figure 5:
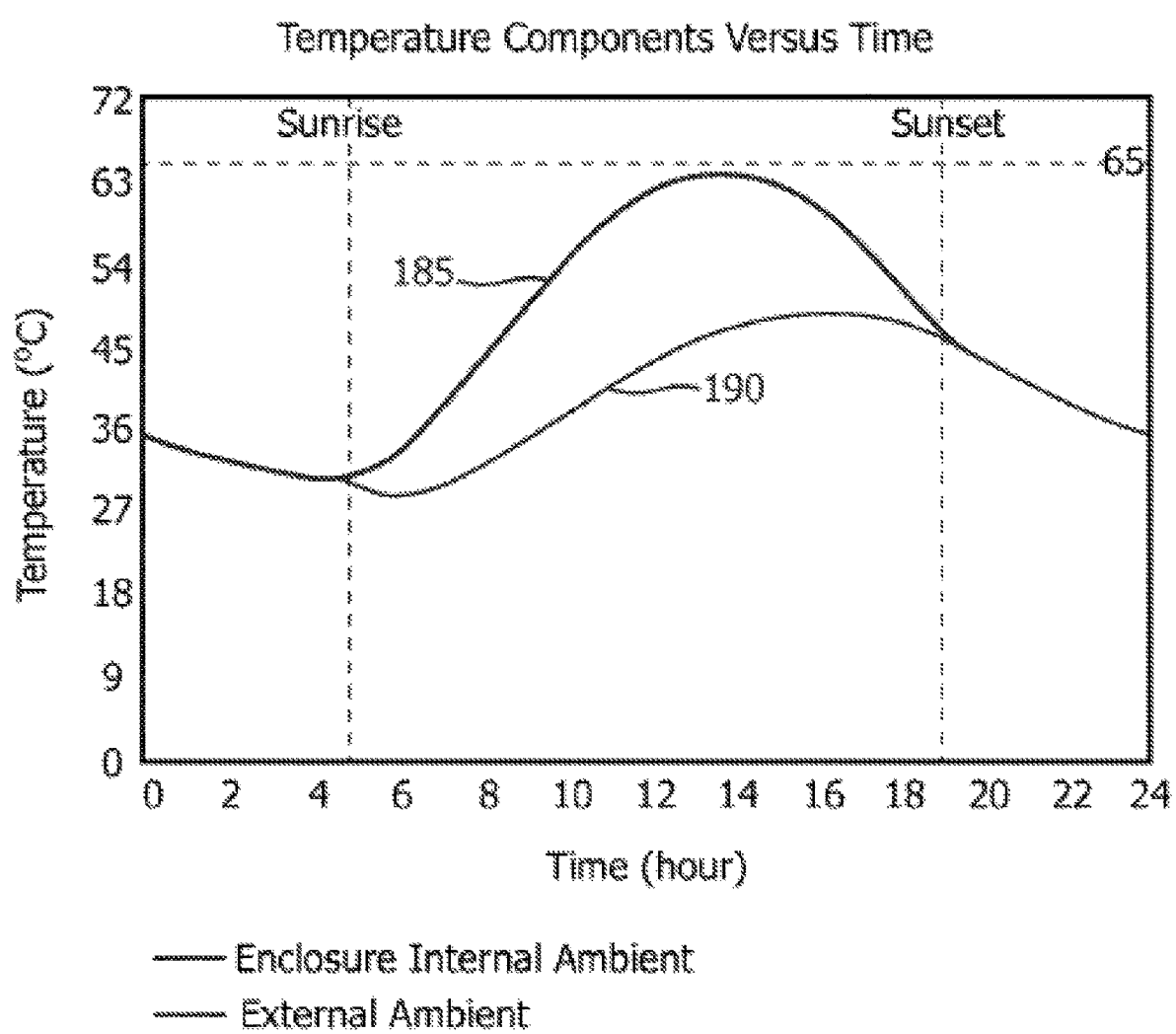
FIG. 5 shows a diagram of an internal temperature of a lamp and ambient temperature versus time.

FIG. 5 shows a diagram of an internal temperature profile 185 of a lamp and an ambient temperature profile 190 versus time for a sunrise-sunset time cycle. The diagram shows that the ambient temperature may be used most of the time when the lamps are turned on, i.e. approximately from two hours before sunset until approximately two hours after sunrise. In fact, during this time, the internal temperature profile 185 and the ambient temperature profile 190 substantially overlap. Highest differences between the two profiles 185 and 190 occur at midday when typically the lamps are turned off.

As a consequence, in order to estimate the end-of-life of the lamp, the ambient temperature measured by a nearby weather station may be a parameter of same or comparable accuracy of the internal temperature measured by a sensor.

Figure 6:
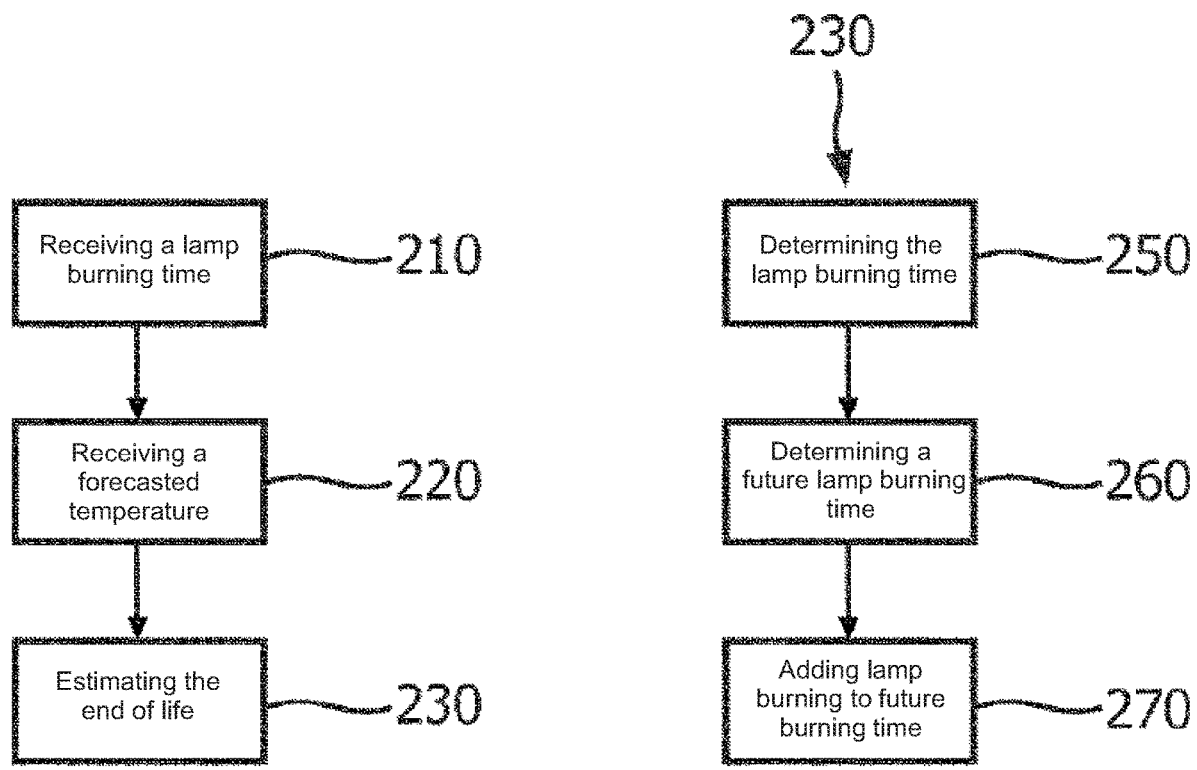
FIG. 6 shows a schematic representation as a flow chart of a method of estimating an end of life of at least one lamp of a lighting system.

FIG. 6 shows a schematic representation as a flow chart of a method of estimating an end of life of at least one lamp of a lighting system according to an embodiment. The method comprises:
  receiving 210 a lamp burning time during which the at least one lamp is turned on,
  receiving 220 a forecasted temperature over a selected period of time in the future at a location of the at least one lamp, and
  estimating 230 the end-of-life of the at least one lamp based on the lamp burning time and the forecasted temperature.
Estimating (230) the end-of-life may further comprise:
  determining 250 the lamp burning time over a period of time in the past up to the present,
  determining 260 a future lamp burning time over the selected period of time in the future based on the forecasted temperature, and
  adding 270 the determined lamp burning time to the future burning time to obtain a corrected lamp burning time at a date corresponding to an end of the selected period of time in the future.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. Moreover, a given step may not have finished completely before a next step is started.

A method according to an embodiment may be executed using software, which comprises instructions for causing a processor system, e.g. comprising the processing unit 20, to perform the methods. Software may only include those steps taken by a particular sub-entity of the system. The software may be stored in a suitable storage medium, such as a hard disk, a floppy, a memory etc. The software may be sent as a signal along a wire, or wireless, or using a data network, e.g., the Internet. The software may be made available for download and/or for remote usage on a server. A method may be executed using a bitstream arranged to configure programmable logic, e.g., a field-programmable gate array (FPGA), to perform the method.

It will be appreciated that the invention also extends to computer programs, particularly computer programs on or in a tangible carrier, adapted for putting the invention into practice. The program may be in the form of source code, object code, a code intermediate source and object code such as partially compiled form, or in any other form suitable for use in the implementation of the method according to an embodiment. An embodiment relating to a computer program product comprises computer executable instructions corresponding to each of the processing steps of at least one of the methods set forth. These instructions may be subdivided into subroutines and/or be stored in one or more files that may be linked statically or dynamically. Another embodiment relating to a computer program product comprises computer executable instructions corresponding to each of the means of at least one of the systems and/or products set forth.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A lighting system comprising at least one lamp, a processing unit for estimating an end of life of the at least one lamp, and a weather station communicatively connected to the processing unit, wherein the weather station is arranged in proximity of the at least one lamp, the processing unit being configured to:

receive a lamp burning time during which the at least one lamp is turned on, receive, from the weather station, a forecasted temperature for the weather at a location of the at least one lamp for a selected period of time in the future, and estimate the end of life of the at least one lamp based on the lamp burning time and the forecasted temperature; and the weather station is configured to:

forecast the temperature at the location of the at least one lamp, and send the forecasted temperature to the processing unit.

2. The lighting system as claimed in claim 1, wherein the processing unit is configured to:

determine the lamp burning time over a period of time in the past up to the present, and determine a future lamp burning time over the selected period of time in the future based on the forecasted temperature, and add the determined lamp burning time to the future burning time to obtain a corrected lamp burning time at a date corresponding to an end date of the selected period of time in the future.

3. The lighting system as claimed in claim 2, wherein the processing unit is configured to determine the future lamp burning time based on the determined lamp burning time or on forecasted weather data.

4. The lighting system as claimed in claim 2, wherein the processing unit is configured to:

compare the corrected lamp burning time to a laboratory burning time obtained during lifetime test for one or more dates, and select one of the dates whose corrected lamp burning time corresponds to the laboratory burning time for estimating the end of life of the at least one lamp.

5. The lighting system as claimed in claim 2, wherein the processing unit is configured to:

determine a first correction factor depending on the forecasted temperature, determine the future lamp burning time by multiplying the determined lamp burning time by the first correction factor and the selected period of time in the future, wherein the selected period of time is chosen by a user.

6. A lighting system as claimed in claim 1, wherein the processing unit is further configured to receive a measured temperature for the at least one lamp and to estimate the end of life of the at least one lamp also based on the measured temperature.

7. The lighting system as claimed in claim 6, wherein the processing unit is configured to:

determine a second correction factor depending on the measured temperature, multiplying the determined lamp burning time by the second correction factor.

8. The lighting system as claimed in claim 6, further comprising at least one temperature sensor coupled to the at least one lamp wherein the at least one temperature sensor is configured to measure the temperature of the at least one lamp.

9. The lighting system as claimed in claim 1, wherein the forecasted temperature is a forecasted average temperature over a period of one year.

10. The lighting system as claimed in claim 1, wherein the forecasted temperature depends on a period of the year.

11. The lighting system as claimed in claim 1, further comprising at least one burning time sensor coupled to the at least one lamp, wherein the at least one burning time sensor is configured to measure the burning time of the at least one lamp.

12. The lighting system as claimed in claim 1, further comprising at least one location sensor coupled to the at least one lamp, wherein the at least one location sensor is configured to provide the location of the at least one lamp to the processing unit.

13. The lighting system as claimed in claim 1, wherein the weather station is further configured to:

measure the temperature in proximity of the at least one lamp, and send the measured temperature to the processing unit.

14. A method of estimating an end of life of at least one lamp of a lighting system, the lighting system further including a processing unit and a weather station, wherein the weather station is arranged in proximity of the at least one lamp and is communicatively connected to the processing unit, the method comprising:

estimating the end-of-life of the at least one lamp based on a lamp burning time during which the at least one lamp is turned on and a forecasted temperature determined by the weather station over a selected period of time in the future at a location of the at least one lamp.

* * * * *